United States Patent [19] [11] 4,143,384
Kim et al. [45] Mar. 6, 1979

[54] LOW PARASITIC CAPACITANCE DIODE

[75] Inventors: Chung K. Kim, Lexington; Alfred J. Wheeler, Berlin, both of Mass.

[73] Assignee: Raytheon Company, Lexington, Mass.

[21] Appl. No.: 770,130

[22] Filed: Feb. 18, 1977

Related U.S. Application Data

[63] Continuation of Ser. No. 639,675, Dec. 11, 1975, abandoned, which is a continuation of Ser. No. 469,173, May 13, 1974, abandoned.

[51] Int. Cl.$^2$ ............... H01L 29/48; H01L 29/06
[52] U.S. Cl. .................................. 357/15; 357/55; 357/68; 357/89; 357/13
[58] Field of Search ............... 357/3, 15, 55, 89, 68, 357/13

[56] References Cited

U.S. PATENT DOCUMENTS

| 3,516,017 | 6/1970 | Kanelco et al. | 357/3 |
| 3,646,411 | 2/1972 | Iwasa | 357/15 |
| 3,742,317 | 6/1973 | Shao | 357/15 |
| 3,808,470 | 4/1974 | Kniekamp | 357/15 |

OTHER PUBLICATIONS

Sze, Physics of Semiconductor Devices (Wiley, NY, 1969), p. 43.

Primary Examiner—William D. Larkins
Attorney, Agent, or Firm—M. D. Bartlett; J. D. Pannone; H. W. Arnold

[57] ABSTRACT

A semiconductor device with active junction area determined by the surface of the floor of a hole etched into a body of semiconductor material. A body of highly doped semiconductor material is overlayed with two layers of semiconductor material of the same conductivity type. The layer in contact with the highly doped body is moderately doped while the upper layer is very lightly doped. A hole is etched through the top layer extending slightly into the moderately doped layer. A Schottky barrier contact is plated throughout the etched region. The total parasitic capacitance of such devices is much lower than that of prior art devices and the reverse breakdown characteristics are improved.

6 Claims, 13 Drawing Figures

4,143,384

LOW PARASITIC CAPACITANCE DIODE

CROSS-REFERENCE TO RELATED CASES

This is a continuation of application Ser. No, 639,675, filed Dec. 11, 1975, which is a continuation of application Ser. No. 469,173, filed May 13, 1974, both now abandoned.

BACKGROUND OF THE INVENTION

Mixer diodes are widely employed in the microwave receivers for mixing of a local oscillator signal with the received signal. Such diodes operate with very low incoming signal levels as there is ordinarily no amplifying stage ahead of the diodes. The low level of the received signals necessitates an extremely small junction area for the diodes. In the prior art, diodes for the above stated mixing purpose were fabricated by covering a body of semiconductor material with a layer of quartz, drilling an extremely small hole through the quartz and into the semiconductor material and plating a Schottky barrier junction through the hole and onto the surface of the body of semiconductor material exposed through the hole extending onto the quartz. Unfortunately, diodes fabricated with this process have been found to have undesirably high values of parasitic capacitance between the metal forming the Schottky barrier layer and the body of semiconductor material. Such high capacitance reduced the efficiency of the diodes as well as the maximum frequency at which such diodes could be profitably employed. The high capacitance arose primarily from two factors. First, the practical upper limit for the thickness of the quartz layer has been restricted by present semiconductor processing techniques to approximately one micron. Secondly, quartz has a relatively high dielectric constant compared to the dielectric constant of low conductivity depleted semiconductor material.

Moreover, prior art devices suffered from low reverse bias breakdown voltage since the abrupt edges of the Schottky barrier metal layer lay directly upon the surface of the semiconductor layer with which the junction was formed.

SUMMARY OF THE INVENTION

Accordingly, it is an objective of the present invention to provide microwave mixer diodes with reduced parasitic capacitance.

It is moreover an object of the present invention to provide microwave mixer diodes with low dielectric constant material between the Schottky barrier metal layer and body of semiconductor material.

It is moreover an object of the present invention to provide microwave mixer diodes with improved reverse bias characteristics.

These, as well as other objectives, may be met by providing diodes with a layer or region of lightly doped semiconductor material of the same conductivity type as that forming the junction but of lower conductivity separating the inactive portions of the Schottky barrier metal contact from the semiconductor material forming the junction with the Schottky barrier metal.

Devices in accordance with the present invention may be fabricated by the method of first providing a body of semiconductor material of high conductivity. On at least one surface of the body of semiconductor material of high conductivity is deposited a first layer of the same conductivity type but having a moderate conductivity. On top of the first layer is deposited a second layer of semiconductor material of the same conductivity type as the first mentioned layer and semiconductor body, the second layer having low conductivity. A hole is etched by masking and photoresistive techniques through the second layer with a hole diameter chosen for proper fabrication of a microwave mixer diode. The hole is preferably extended slightly into the second layer. A Schottky barrier metal contact is deposited throughout the sides and floor of the hole extending slightly over the surface of the second layer. The Schottky metal contact is fabricated from a metal having a low work function and may, for example, be platinum, nickel or an alloy of gold and germanium. The semiconductor material used for all three layers may be any semiconductor material including silicon, germanium or, as is used in the preferred embodiment, gallium arsenide. Either N- or P-type material may be used although N- is preferable because of its higher mobility of majority carriers. The moderately doped first layer has a doping density in the range $5 \times 10^{15}$ to $10^{17}$ atoms/cm$^3$ while the second layer has a doping density in the range $10^{14}$ to $5 \times 10^{15}$ atoms/cm$^3$ or lower. The second layer has a thickness of two microns or more while the first layer has a thickness in the range of one to three microns. The highly doped region has a doping density in the range $2 \times 10^{17}$ to $2 \times 10^{18}$ atoms/cm$^3$ and has a preferred thickness in the range of 10 to 20 microns after having been thinned for mounting upon a heat sink. In a preferred embodiment, the doping density of the first layer is $3 \times 10^{16}$ atoms/cm$^3$, the second layer $3 \times 10^{15}$ atoms/cm$^3$, and the third layer $10^{18}$ atoms/cm$^3$.

DESCRIPTION OF THE PREFERRED EMBODIMENT

Figure 1A:
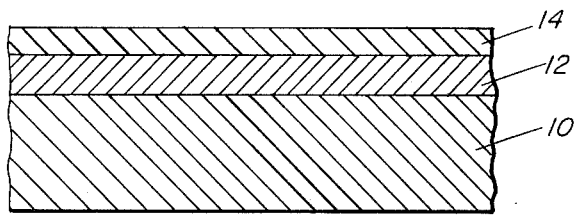
FIGS. 1A–C are a series of cross-sectional views showing various steps of construction of a diode in accordance with the present invention.
Figure 1B:
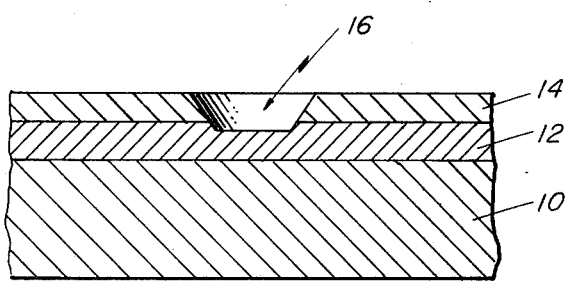

Referring now to FIGS. 1A–C and FIG. 2, there is shown a device in accordance with the present invention in various stages of fabrication. Fabrication is commenced with the provision of a wafer or body 10 of semiconductor material having a relatively high conductivity. In the preferred embodiment, gallium arsenide is used having a doping density in excess of $10^{18}$ carriers/cm$^3$ although other types of semiconductor material such as silicon and germanium may be used as well. The thickness of the semiconductor body 10 may be 100 microns or greater although its thickness is not critical since it will be later thinned to between 10 and 20 microns. Atop semiconductor body 10 is deposited first layer 12 of the same conductivity type as semiconductor body 10 with a preferred doping density of approximately $3 \times 10^{16}$ atoms/cm$^3$. The thickness of first layer 12 is preferably between one and three microns although other thicknesses could be used depending upon the precise application and total parasitic capacitance permitted. Atop first layer 12 is deposited second layer 14 having a very light doping density. Second layer 14 has a preferred doping density of $3 \times 10^{15}$ atom/cm$^3$ or less. The nearer to intrinsic material the lower will be parasitic capacitance. Both layers 12 and 14 are preferably deposited by the well-known vapor deposition technique although any method of forming or growing semiconductor layers may be used.

The exposed surface of second layer 14 is then coated with photoresistive material. A mask is positioned with a hole above region 16 and the entire device exposed to light and developed. The photoresistive material is then removed chemically above the area where hole 16 is to be formed. Hole 16 is then etched through second layer 14 extending slightly into first layer 12. The remaining photoresistive material is then removed. The diameter of hole 16 in the preferred embodiment is 10 microns measured at the bottom of the hole. Other diameters may be used depending upon power level requirements and maximum parasitic capacitance permitted.

The next step in the fabrication process is to deposit the Schottky barrier metal contact 18 over the entire area etched out of second layer 14, first layer 12, and on to the surface of first layer 12 to a sufficient extent to permit outside contact to be made. In the preferred embodiment, the total diameter of Schottky barrier contact 18 on top of the surface of second layer 14 is 30 microns. Schottky barrier metal contact 18 has a thickness preferably less than one micron. Any of a number of low work function metals may be used for Shottky barrier metal contact 18, for example, nickel, platinum or an alloy of gold and germanium. Of course, many such diodes may be produced at once using batch processing methods.

Figure 1C:
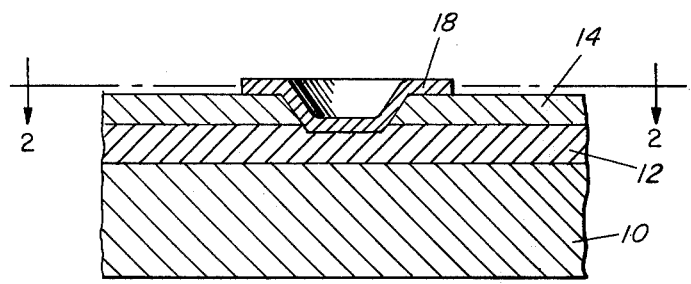
Figure 2:
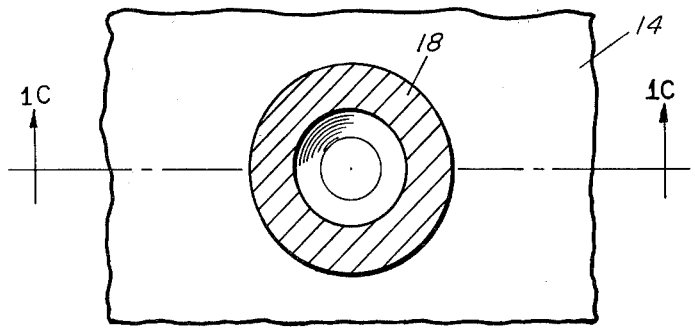
FIG. 2 is a plan view of the fabricated device shown in FIG. 1C.

A plan view of the device of FIG. 1C is shown in FIG. 2. The hole and Schottky barrier contact 18 are shown therein as being circular although the invention is by no means limited to circular contacts. Elliptical or square-shaped holes or any other shape may be used depending upon the application, frequency of applied signals, semiconductor processing techniques used, maximum signal and power levels, or maximum parasitic capacitance permitted.

Referring again to FIG. 1C, a comparison may be made contrasting diodes fabricated in accordance with the present invention with prior art diodes. In the prior art, microwave mixer diodes were constructed with a layer of an insulating material such as quartz separating the lip and sides of the Schottky barrier contact from the junction forming semiconductor layer. The hole through the quartz or insulating layer extended only as far as the surface of the semiconductor material. Since quartz has a relatively high dielectric constant and the thickness of the quartz layer is limited by available processing techniques to approximately one micron, the parasitic capacitance formed by the lip and sides of the Schottky barrier contact was very high. Furthermore, since the edge of the Schottky barrier contact was located directly upon the surface of the junction forming semiconductor material, edge breakdown problems and reverse biasing problems were inherent because of the high electric field produced at these edges when the diodes are reverse biased. In contrast, as is shown in FIG. 1C, the upper layer may be made any desired practical thickness, here two microns or greater. Also, the relatively lightly doped upper layer or third layer 14 has a much smaller relative dielectric constant than quartz when bias is applied since the layer will be depleted of carriers. The parasitic capacitance of the device is thereby reduced. Moreover, many such diodes, as the one illustrated in FIG. 1C, may be fabricated upon the same semiconductor wafer thus allowing for batch processing making the total cost for each diode much less.

Figure 4:
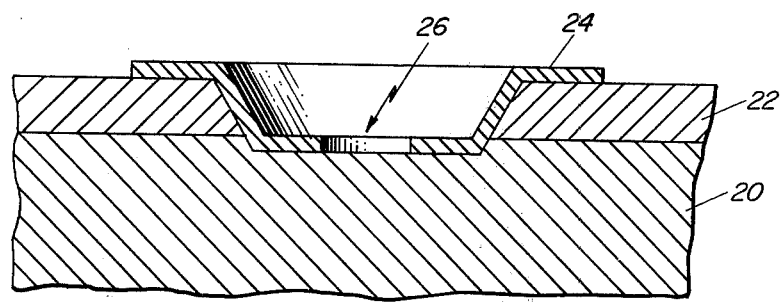
FIG. 4 is a cross-sectional view of an alternative embodiment of the diode.

In FIG. 4 is shown an alternative embodiment such as would be used in fabricating other types of devices such as would be used in an IMPATT type diode. IMPATT diodes are frequently employed in amplifying and producing microwave signals. The device of FIG. 4 is fabricated by essentially the same techniques as the device shown in FIGS. 1C and 2 except the dimensions of the various elements are changed to be appropriate for IMPATT type diodes and a hole 26 is left in the center of the floor of Schottky barrier metal contact 24. Such a geometric arrangement provides for a diode junction shaped in the form of an annulus. Heat transfer away from the junction, which is important in high powered amplifying applications, is much more rapid than if the junction were spread over the entire floor. The device shown in FIG. 4 retains all of the low parasitic capacitance and improved reverse bias properties of the device previously described.

Figure 3:
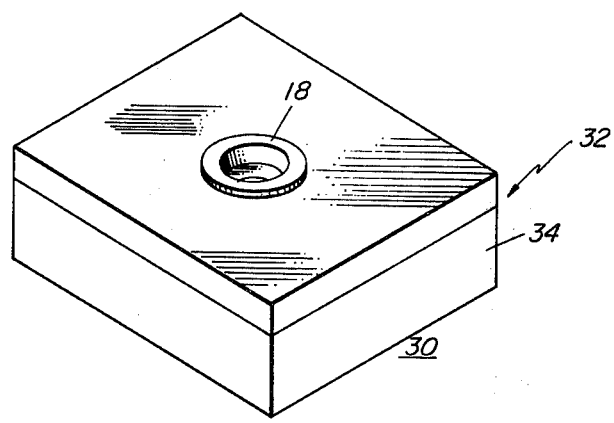
FIG. 3 is a perspective view of a diode in accordance with the present invention mounted upon a heat sink.

In FIG. 3 is shown generally at 30 a device such as one shown in FIG. 1C or 2 which has been mounted upon a heat sink 30 prior to being inserted in an overall device package. First, the portion of the wafer containing the diode is scribed and cut to approximate dimensions of 500 microns by 500 microns. The wafer is then thinned to a preferred thickness in the range of 10 to 20 microns and then thermally and electrically coupled to the top surface of heat sink 30. Semiconductor device 32 and heat sink 30 together have a preferred overall total thickness of 100 microns. The anode connection to the diode 30 is made to Schottky barrier metal contact 18. The cathode connection is made through heat sink 34 and the highly conductive semiconductor body.

Figure 5:
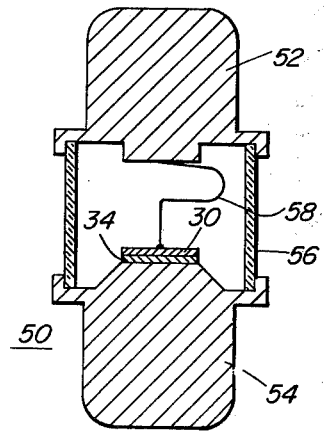
FIG. 5 is a cross-sectional view of a device in accordance with the present invention in a preferred package.

In FIG. 5 there is shown generally at 50 a cross-sectional view of a device such as is illustrated in FIG. 3 packaged for use is an external circuit application. Cylindrical end contacts 52 and 54 are fabricated of an electrically and thermally conductive material such as copper or brass and coated with a highly conductive material such as gold and fashioned in a form to make proper contact with the utilization circuit in which the device is employed. Cylindrical glass insulator 56 separates and electrically insulates contacts 52 and 54 from one another. Device 30 including heat sink 34 is thermally and electrically coupled to contact 54. Contact 54 is also in electrical contact through heat sink 34 to the cathode of the diode. Wire contact 58 is bonded to both contact 52 and to the anode of the diode formed by Schottky barrier contact 18 as in FIG. 3.

Figure 6:
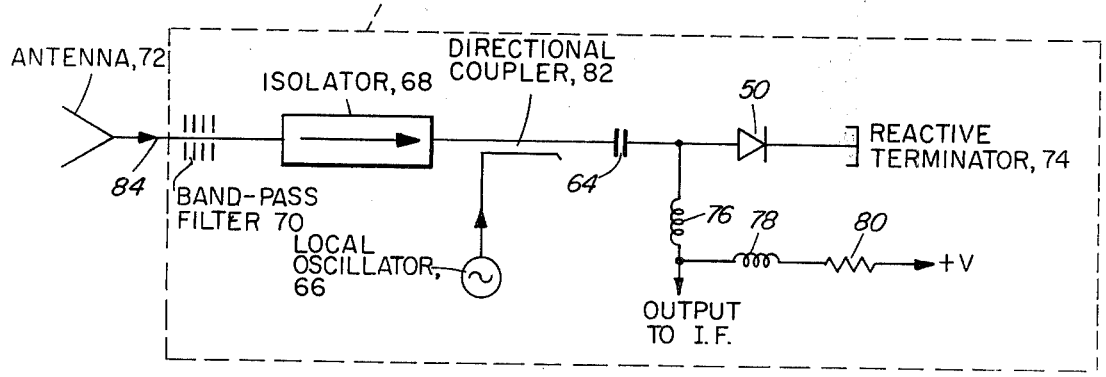
FIG. 6 is a schematic diagram of a microwave receiver circuit using the present invention to advantage.

Referring now to FIG. 6, there is shown a schematic diagram of the RF portions of a microwave signal receiver. Such a circuit may be used in a microwave radio receiver or in a radar receiver. Horn antenna 72 intercepts the transmitted microwave signals and couples them to wave guide 84. Wave guide 84 couples the received signals to receiver RF stage 60 which is preferably constructed as a microwave integrated circuit with stripline conductors. The signal is passed through bandpass filter 70 to eliminate much of the noise present in the received signal at antenna 72. The filtered signal is coupled through isolator 68 past directional coupler 82 where the internally generated signal from local oscillator 66 is algebraically added to the received and filtered signal. Isolator 68 prevents the signal from local oscillator 66 from passing back out to antenna 72 and being radiated therefrom. After the received filtered signal is added with the signal from local oscillator 66, the combined signal is coupled through capacitor 64 to the anode of diode 50. The actual mixing or multiplication of the two combined signals is accomplished in diode 50 by the well-known technique of biasing the diode in a non-linear region. Reactive terminator 74 terminates the cathode of diode 50 and provides a return path for the DC bias applied to the diode 50. The output signal to the IF amplifier is extracted from the circuit through indictor 76. DC bias voltage is supplied through current limiting resistor 80 and choke 78 through inductor 76 to the anode of diode 50.

Figure 7A:
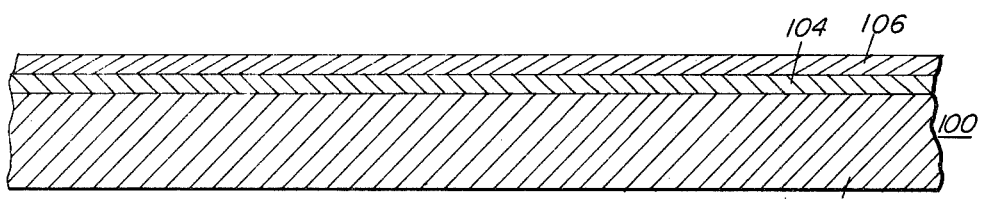
FIGS. 7A–E are a series of cross-sectional views showing devices in accordance with the present invention in various steps of construction by an alternate fabrication method.
Figure 7B:
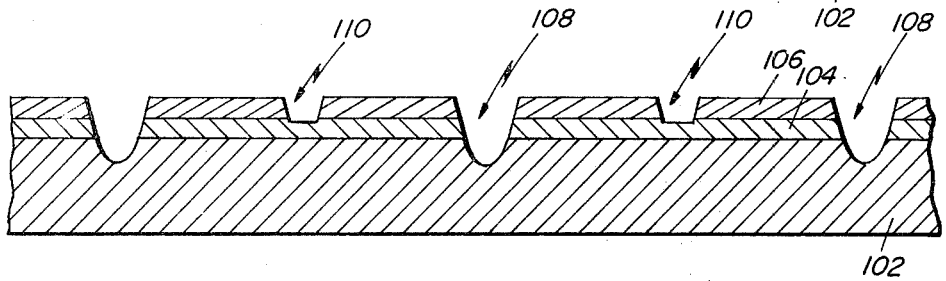

Referring now more particularly to FIGS. 7A through 7E, there are shown steps in the fabrication process of devices in accordance with the present invention. The fabrication is commenced with the providing of a wafer 100 with highly doped substrate 102, active first layer 104 of moderate doping density, and insulating second layer 106 of low doping density. The doping densities and thicknesses of the three layers may be as shown in and as described in conjunction with FIGS. 1A–C and FIG. 2. Secondly, as shown in FIG. 7B, two etchings are made through the upper surfaces of semiconductor wafer 100. Holes 110 are etched as before for provision of the Schottky barrier junctions. Troughs 108 are etched through first and second layers 104 and 106 and extending into substrate 102. Troughs 108 extend both horizontally and vertically along the surface of semiconductor wafer 100 enclosing each individual diode site. Spacing between troughs may, for example, be 500 microns as in the preferred embodiment described above.

Figure 7C:
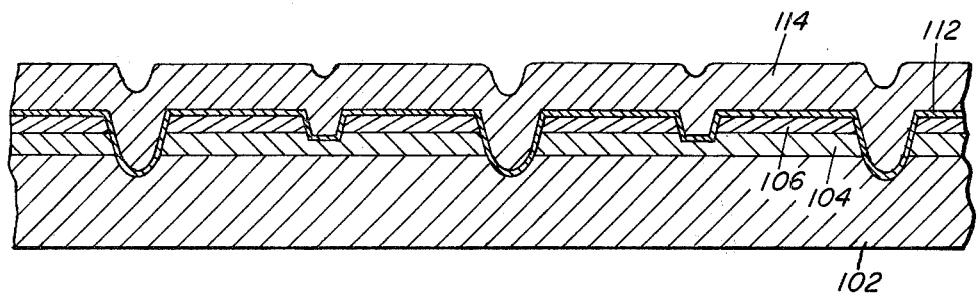

Next, as shown in FIG. 7C, the entire surface of the device is covered with a layer 112 of metal which is used to form the Schottky barrier contact layer and diode junctions. The thickness of this layer may be the same as in the previously described device. Atop Schottky barrier metal layer 112 is deposited a protective layer 114 of easily removable material which may be, for example, chromium-gold alloy or silicon dioxide. Layer 114 should be thick enough to provide mechanical support for the device during subsequent mechanical working.

Figure 7D:
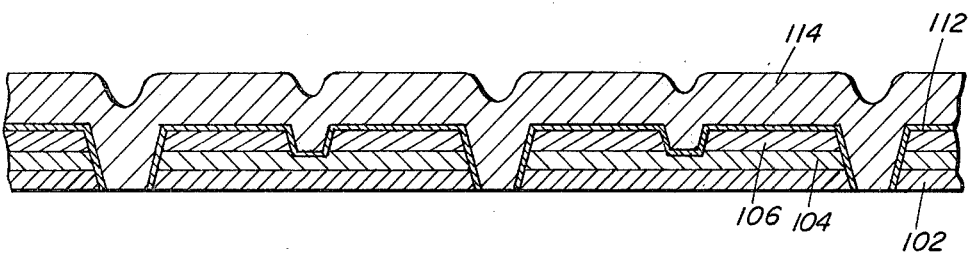

Then, as shown in FIG. 7D, most of semiconductor substrate 102 is removed from the lower side of the device leaving the device with a total remaining thickness of as small as 10 microns. Any desired thickness can, of course, be produced. Substrate 102 can be thinned by lapping, grinding, or etching. The remaining thickness of substrate 102 is indicated by the extent of the exposure and width of the exposed portions of troughs 108. By monitoring the width of the exposed portions of the troughs 108 as the thinning progresses, highly accurate control of the thickness of substrate 102 may be obtained.

Figure 7E:
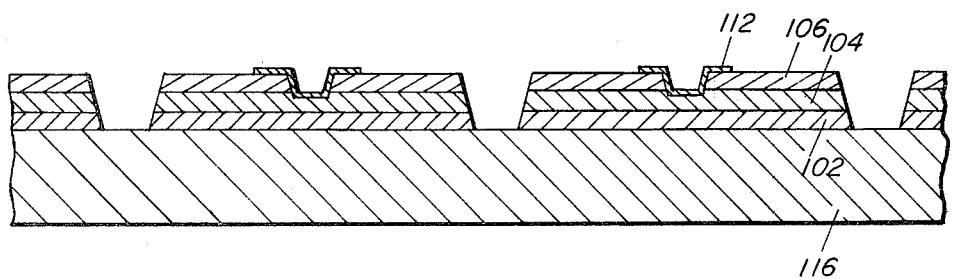

Finally, as seen in FIG. 7E, a heat sink 116, preferably silver, is thermally and electrically bonded to the lower surface of the remaining substrate 102. Protective layer 114 is then chemically removed and Schottky barrier metal layer 112 etched to the preferred shape. Individual diode units may then be cut apart.

Diodes constructed in accordance with the above-described process have exceptionally good thermal and electrical conductivity from the junction formed by Schottky barrier metal layer 112 and first layer 104 to heat sink 116. Batch fabrication using this process is both economical and easily performed.

Although preferred embodiments of the invention have been described, numerous modifications and alterations thereto would be apparent to one skilled in the art without departing from the spirit and scope of the present invention.

What is claimed is:

1. In combination:
a first layer of gallium arsenide semiconductor material of doping density in the range of $5 \times 10^{15}$ to $10^{17} /cm^3$;
a second layer of gallium arsenide semiconductor material of the same conductivity type as said first layer of doping density below $5 \times 10^{15} /cm^3$ contiguous to said first region; and
A Schottky barrier junction in the form of an annulus comprising a layer of schottky barrier junction forming metal extending through a hole in said second layer and contacting said first layer, said layer of Schottky barrier junction forming metal having a bottom portion, sidewall portions, and an upper portion, the outer surface of said bottom portion contacting only said first layer, the juncture between said bottom portion and said sidewall portions being within said first layer and contacting said first layer, at least portions of the outer surface of said sidewall portions contacting said second layer, and said upper portion being of annular shape with the outer surface of said upper portion contacting said second layer.

2. The combination of claim 1 wherein said metal is selected from the group consisting of nickel, platinum and gold-germanium alloy.

3. The combination of claim 2 wherein the thickness of said second layer is greater than one micron.

4. The combination of claim 3 further comprising a third layer of gallium arsenide semiconductor material of the same conductivity type of said first and second layers, said third region being contiguous to said first layer and said third layer being highly doped.

5. The combination of claim 4 further comprising a heat sink thermally coupled to said third layer.

6. A semiconductor device comprising in combination:
a first region of gallium arsenide semiconductor material of doping density in the range of $5 \times 10^{15}$ to $10^{17} /cm^3$; means for forming a Schottky barrier junction in the form of an annulus below the surface of said first region of semiconductor material; means for providing contact to said Schottky barrier junction, said contact providing means having upper and sidewall portions, said contact providing means being isolated from said semiconductor body by a second region of semiconductor material of doping density below $5 \times 10^{15} /cm^3$, portions of said sidewall portions of said contact providing means contacting said second region, the juncture between said means for forming a Schottky barrier junction and said contact providing means being within said first region of semiconductor material and contacting said first region of semiconductor material, and said upper portion being of annular shape with the outer surface of said upper portion contacting said second region.

* * * * *